(12) United States Patent
Lee et al.

(10) Patent No.: US 11,604,528 B2
(45) Date of Patent: Mar. 14, 2023

(54) DISPLAY DEVICE

(71) Applicant: SAMSUNG DISPLAY CO., LTD., Yongin-si (KR)

(72) Inventors: Seung Hee Lee, Hwaseong-si (KR); Hyo Chul Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/550,029

(22) Filed: Dec. 14, 2021

(65) Prior Publication Data

US 2022/0357809 A1 Nov. 10, 2022

(30) Foreign Application Priority Data

May 7, 2021 (KR) .................. 10-2021-0059302

(51) Int. Cl.
*G06F 3/041* (2006.01)
*G06F 3/044* (2006.01)
*H05K 1/11* (2006.01)

(52) U.S. Cl.
CPC ............ *G06F 3/0412* (2013.01); *G06F 3/044* (2013.01); *G06F 3/04164* (2019.05); *H05K 1/115* (2013.01); *H05K 2201/10128* (2013.01)

(58) Field of Classification Search
CPC .... G06F 3/0412; G06F 3/04164; G06F 3/044; H05K 1/115; H05K 2201/10128
See application file for complete search history.

(56) References Cited

U.S. PATENT DOCUMENTS

| | | | |
|---|---|---|---|
| 2009/0200682 A1* | 8/2009 | Zhang | H01L 21/486 174/266 |
| 2011/0240348 A1* | 10/2011 | Lau | H05K 3/429 174/257 |
| 2012/0326990 A1* | 12/2012 | Wurzel | G02F 1/13338 345/173 |
| 2016/0286649 A1* | 9/2016 | Choi | H05K 1/147 |
| 2017/0358847 A1* | 12/2017 | Cho | H05K 1/0218 |
| 2020/0312761 A1* | 10/2020 | Jang | H01L 23/4985 |
| 2021/0099560 A1* | 4/2021 | Kim | H05K 1/181 |
| 2022/0201858 A1* | 6/2022 | Xiong | G06F 3/0446 |

FOREIGN PATENT DOCUMENTS

KR 10-2003-0007103 1/2003

* cited by examiner

*Primary Examiner* — Hong Zhou
(74) *Attorney, Agent, or Firm* — F. Chau & Associates, LLC

(57) ABSTRACT

A display device includes: a panel including a display region and a touch region; and a circuit board, and including a first conductive layer, a second conductive layer and a first insulating layer between the first conductive layer and the second conductive layer. The circuit board includes: a plurality of data lines electrically connected with a plurality of data signal lines; a plurality of touch lines electrically connected with a plurality of touch electrodes; and a first ground line disposed between at least two or more of the plurality of data lines and the plurality of touch lines. The first ground line includes a first part of the first conductive layer, a first part of the second conductive layer, and a first via passing through the first insulating layer and connecting the first part of the first conductive layer with the first part of the second conductive layer.

20 Claims, 9 Drawing Sheets

DISPLAY DEVICE

CROSS-REFERENCE TO RELATED APPLICATION

This application claims priority under 35 U.S.C. § 119 to Korean Patent Application No. 10-2021-0059302 filed on May 7, 2021, in the Korean Intellectual Property Office, the disclosure of which is incorporated by reference herein in its entirety.

TECHNICAL FIELD

The present invention relates to a display device, and more particularly, to a display device including a first conductive line and a second conductive line connected to each other by a via.

DESCRIPTION OF THE RELATED ART

Various electronic devices, such as a smart phone, a digital camera, a notebook computer, a navigator and a smart television, which provide a user with an image, includes a display device for displaying an image. The display device includes a display panel for displaying a screen, and various input devices. An example of the input devices includes a touch panel for sensing a touch input by a person's body portion (for example, a finger).

The display device includes signal lines to provide various functions such as a display function and a touch input. Typically, the signal lines transfer a signal from a main processor, and may be disposed on a circuit board connecting the display panel with the main processor.

When the signal lines, to which various signals are applied, are disposed on the circuit board and are disposed by two or more layers, mutual interference may occur due to a parasitic capacitor between the signal lines.

SUMMARY

According to an embodiment of the present invention, a display device includes: a panel including a display region for displaying an image and a touch region overlapping the display region; and a circuit board disposed at one side of the panel, and including a first conductive layer, a second conductive layer and a first insulating layer interposed between the first conductive layer and the second conductive layer, wherein the circuit board includes: a plurality of data lines electrically connected with a plurality of data signal lines disposed in the display region; a plurality of touch lines electrically connected with a plurality of touch electrodes disposed in the touch region; and a first ground line disposed between at least two or more of the plurality of data lines and the plurality of touch lines, wherein the first ground line includes a first part of the first conductive layer, a first part of the second conductive layer, and a first via passing through the first insulating layer and connecting the first part of the first conductive layer with the first part of the second conductive layer.

In an embodiment of the present invention, the circuit board is divided into a first area positioned at one side of the first ground line and a second are positioned at the other side of the first ground line, and wherein the plurality of data lines or the plurality of touch lines disposed in the first area do not cross the plurality of data lines or the plurality of touch lines disposed in the second area.

In an embodiment of the present invention, the display device further includes a second ground line included in either the first conductive layer or the second conductive layer.

In an embodiment of the present invention, the plurality of data lines includes at least one first data line that is a part of the first conductive layer, and the plurality of touch lines are a part of the second conductive layer.

In an embodiment of the present invention, the plurality of data lines further includes at least one second data line that is a part of the second conductive layer.

In an embodiment of the present invention, the display device further includes a display driving chip disposed on the panel, wherein the panel further includes a ground connection line connecting the first ground line of the circuit board with the display driving chip.

In an embodiment of the present invention, the display device further includes a touch driving chip disposed on the circuit board, wherein at least one of the plurality of touch lines is electrically connected with the touch driving chip.

In an embodiment of the present invention, the circuit board further includes a third conductive layer, and a second insulating layer interposed between the second conductive layer and the third conductive layer, wherein the plurality of data lines includes at least one first data line that is a part of the first conductive layer and at least one second data line that is a of the third conductive layer, and the plurality of touch lines are a part of the second conductive layer.

In an embodiment of the present invention, the circuit board further includes a second ground line disposed between at least two or more of the plurality of data lines and the plurality of touch lines, wherein the second ground line includes the first part of the second conductive layer, a first part of the third conductive layer, and a second via passing through the second insulating layer and connecting the first part of second conductive layer with the first part of the third conductive layer.

In an embodiment of the present invention, the first via and the second via at least partially overlap each other in a thickness direction of the circuit board.

In an embodiment of the present invention, an inner region of the first via is filled with a conductive material.

According to an embodiment of the present invention, a display device includes: a display panel for displaying an image and a circuit board disposed at one side of the display panel, wherein the display panel includes a plurality of conductive lines, wherein the circuit board includes: a plurality of first conductive lines; an insulating layer disposed on the plurality of first conductive lines; a plurality of second conductive lines disposed on the insulating layer; a via hole passing through the insulating layer; and a conductive via disposed in the via hole and electrically connecting at least one of the plurality of first conductive lines with at least one of the plurality of second conductive lines, wherein the conductive via includes an inner side and an outer side, each of which has a closed figure shape on a plane view.

In an embodiment of the present invention, an inner space surrounded by the inner side of the conductive via is filled with air, or is empty.

In an embodiment of the present invention, an inner space surrounded by the inner side of the conductive via is filled with an insulating material.

In an embodiment of the present invention, the insulating material filling the inner space is different from a material of the insulating layer.

In an embodiment of the present invention, an inner space surrounded by the inner side of the conductive via is filed with a conductive material.

In an embodiment of the present invention, the outer side of the conductive via has a diameter of about ½ or more of a line width of each of the plurality of first conductive lines.

In an embodiment of the present invention, the circuit board further includes a plurality of conductive vias including the conductive via and spaced apart from each other in an extended direction of the at least one first conductive line of the plurality of first conductive lines.

In an embodiment of the present invention, a spaced distance between the plurality of conductive vias is smaller than a line width of the at least one first conductive line of the plurality of first conductive lines.

In an embodiment of the present invention, a ground voltage is applied to the at least one first conductive line of the plurality of first conductive lines and the least one second conductive line of the plurality of second conductive lines, which is electrically connected with the at least one first conductive line of the plurality of first conductive lines by the conductive via.

BRIEF DESCRIPTION OF THE DRAWINGS

The above and other features of the present invention will become more apparent by describing in detail embodiments thereof with reference to the attached drawings, in which.

DETAILED DESCRIPTION OF THE DISCLOSURE

Figure 1:
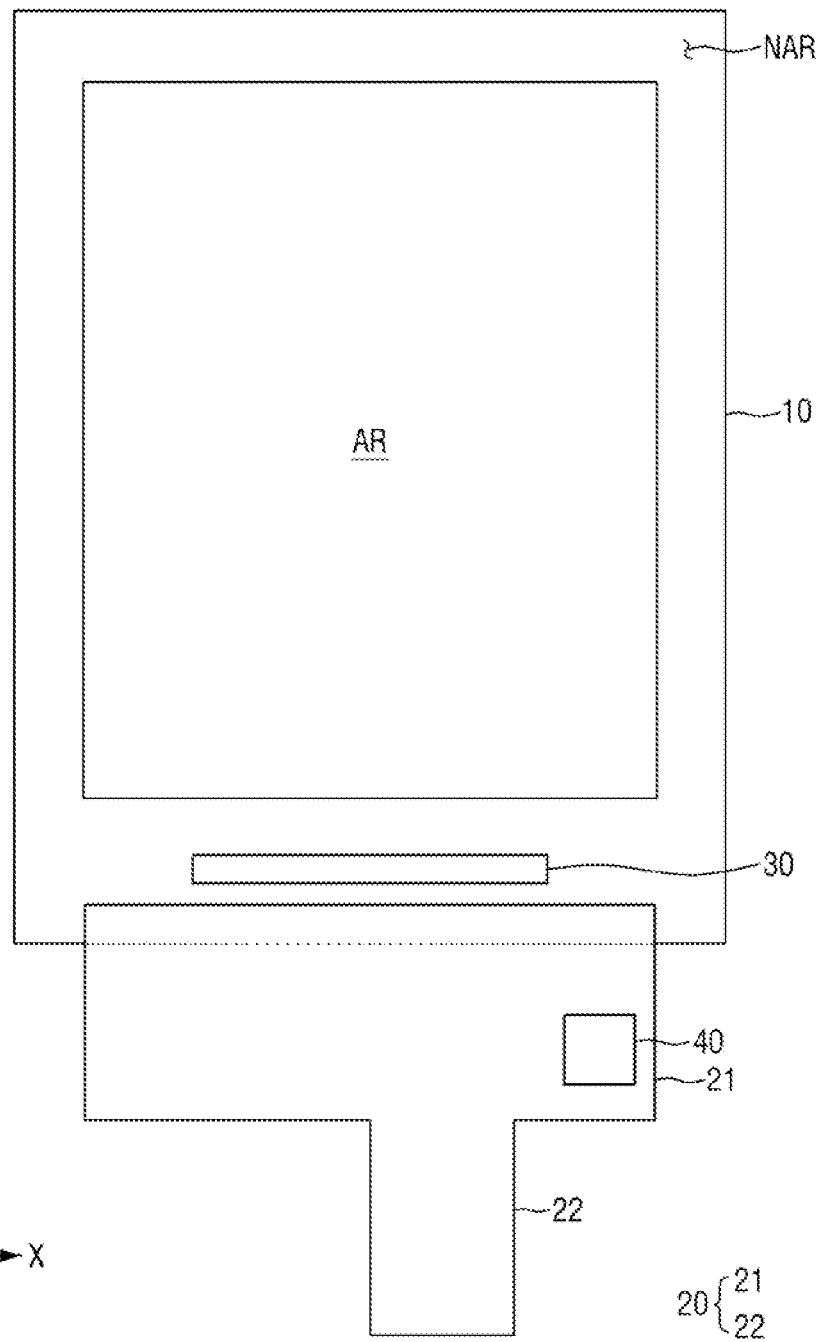
FIG. 1 is a schematic plane view illustrating a display device according to an embodiment of the present invention.

In the following description, for the purposes of explanation, numerous specific details are set forth to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific features, components, and/or arrangements, and/or with one or more equivalent features, components, and/or arrangements. In other instances, structures and devices are shown in block diagram form to avoid unnecessarily obscuring various embodiments, and the present invention is not limited by the scale of the diagrams. Further, various embodiments may be different from one another, but do not have to be exclusive. For example, specific shapes, configurations, and characteristics of an embodiment may be used or implemented in other embodiments without departing from the spirit and scope of the present invention.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the present invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the sizes of elements may be exaggerated for clarity and/or descriptive purposes. When an embodiment nay be implemented differently, a specific process order may be performed differently from the described order. For example, two consecutively described processes may be performed substantially at the am time or performed in an order opposite to the described order. In addition, like reference numerals may denote like elements.

When an element, such as a layer, is referred to as being "on," "connected to," or "coupled to" another element or layer, it may be directly on, directly connected to, or directly coupled to the other element or layer or intervening elements or layers may be present. When, however, an element or layer is referred to as being "directly on," "directly connected to," or "directly coupled to" mother element or layer, there are no intervening elements or layers present. To this end, the term "connected" may refer to, for example, physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, or Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings and scope of the present invention.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is tuned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art. For example, "about" can man within one or more standard deviations, or within ±3% 20%, 10% or 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

Embodiments may be described and illustrated in the accompanying drawings in terms of functional blocks, units, parts, and/or modules. Those skilled in the art will appreciate that these blocks, units, pars, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. In addition, each block, unit, part, and/or module of some embodiments may be physically separated into two or more interacting and discrete blocks, units, parts, and/or modules without departing from the scope of the present invention. Further, the blocks, units, parts, and/or modules of some embodiments may be physically combined into more complex blocks, units, parts, and/or modules without departing from the scope of the present invention.

FIG. 1 is a schematic plane view illustrating a display device according to an embodiment of the present invention.

In the present invention, a first direction X, a second direction Y and a third direction Z are illustrated.

The first direction X refers to a direction parallel with one side of a display device 1 when viewed on a plane, and may be, for example, a horizontal direction of the display device 1. The second direction Y refers to a direction parallel with the other side that is in contact with one side of the display device 1 when viewed on the plane, and may be a vertical direction of the display device 1 when viewed on the plane. For example, the second direction Y may intersect the first direction X. The third direction Z may be a thickness direction of the display device 1. Hereinafter, for convenience of description and as an example, one side of the first direction X (e.g., a positive X-axis direction) refers to a right direction on the plane view and the other side of the first direction X (e.g., a negative X-axis direction) refers to a left direction on the plane view, and one side of the second direction Y (e.g., a positive Y-axis direction) refers to an upper direction on the plane view and the other side of the second direction Y (e.g., a negative Y-axis direction) refers to a lower direction on the plane view. In addition, one side of the third direction Z (e.g., a positive Z-axis direction) refers to an upper direction on a sectional view and the other side of the third direction Z (e.g., a negative Z-axis direction) refers to a lower direction on the sectional view. However, it should be understood that a direction mentioned in the embodiment means a relative direction, and the embodiment is not limited to the mentioned direction.

Various electronic devices for providing a display screen may be included in the display device 1. Examples of the display device 1 may include, but are not limited to, a mobile phone, a smart phone, a table personal computer (PC), a mobile communication terminal, an electronic diary, an electronic book, a personal digital assistant (PDA), a portable multimedia player (PMP), a navigator, an ultra mobile PC (UMPC), a television, a game device, a wrist watch type electronic device, a head mount display, a monitor of a personal computer, a notebook computer, a vehicle dashboard, a digital came, a camcorder, an outdoor signboard, an electric display board, various medical devices, various test devices, various home appliances including a display region, such as a refrigerator or a washing machine, and a device for Internet of things (IoT).

Referring to FIG. 1, at least one of a front surface or a rear surface of the display device 1 may be a display surface. In this case, the "front surface" is a surface positioned at one side of one plane, and is a surface positioned at one side of the third direction Z on the drawing, and the "rear surface" is a surface positioned at the other side of one plane, and is a surface positioned at the other side of the third direction Z on the drawing.

In an embodiment of the present invention, the display surface is positioned on the front surface of the display device 1, and the rear surface of the display device 1 may be a non-display surface. However, the present invention is not limited thereto. For example, the display device 1 may be a dual display device 1 in which a display is made for both the front surface and the rear surface or in which a display surface is on the front surface and a display surface is on the rear surface.

The display device 1 may include a display panel 10 for providing a display screen, a display driving circuit (or, e.g., a display driving chip) 30 and a scan driver 50, which are disposed in an non-active region NAR of the display panel 10, a circuit board 20 disposed in the non-active region NAR of the display panel 10, and a touch driving circuit (or, e.g., a touch driving chip) 40 disposed on the circuit board 20.

Examples of the display panel 10 may include self-emission display panels such as an organic light emitting display panel OLED, an inorganic light emitting display panel EL, a quantum-dot light emitting display panel QED, a micro LED display panel LED, a nano-LED display panel, a plasma display panel PDP, an electric field emission display panel FED, and a cathode ray tube display panel CRT, and a passive emission display panel such as a liquid crystal display panel LCD and an electrophoresis display panel EPD. Hereinafter, as an example, the organic light emitting display panel will be described as the display panel 10, and the organic light emitting display panel applied to the embodiment will simply be abbreviated as the display panel 10 unless required to be specially classified. However, the present invention is not limited to the organic light emitting display panel, and another display panel listed above or known in this at may be applied to the present invention.

The display panel 10 may have a rectangular shape having a short side in the first direction X and a long side in the second direction Y. A corner where the short side of the first direction X and the long side of the second direction Y meet each other may be rounded to have a curvature or may be formed to be orthogonal. However, a plane shape of the display panel 10 is not limited to this shape, and the display panel 10 may have various plane shapes such as another polygonal shape, a circular shape and an elliptical shape. In addition, the display panel 10 may be flexible such that the display panel 10 may be curved, bent, folded or rolled.

The display panel 10 may include a display layer for displaying an image, and a touch layer disposed on the display layer, sensing a touch input.

Figure 2:
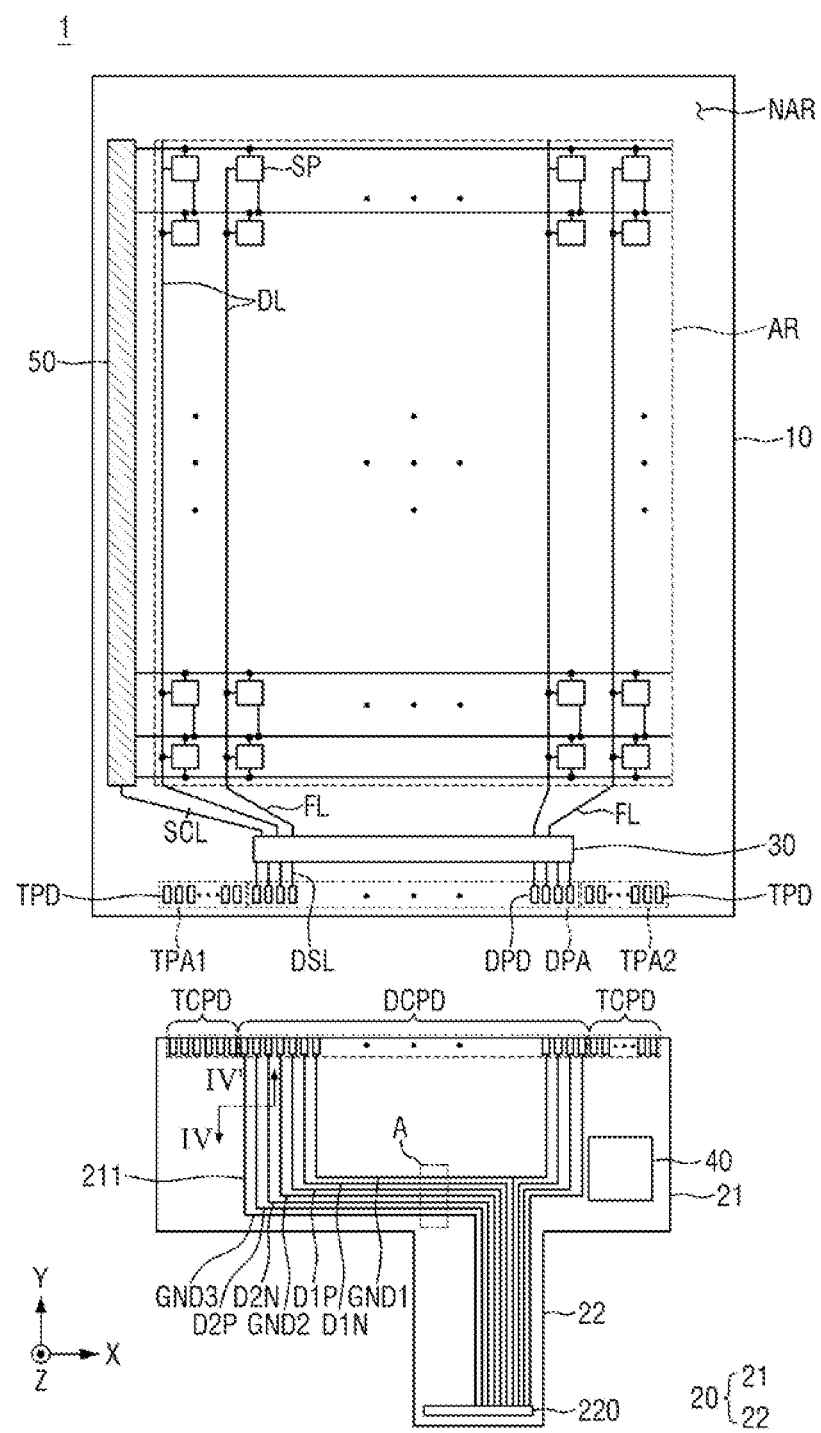
FIG. 2 is a schematic plane view illustrating an arrangement structure of a plurality of data signal lines and a plurality of conductive lines of a circuit board according to an embodiment of the present inventive concept.

The display layer may include a plurality of pixels (SP of FIG. 2). The pixel SP is a unit for displaying an image on the display surface. The pixel SP may include, but is not limited to, a red pixel, a green pixel and a blue pixel. The plurality of pixels SP may be arranged alternately on the plane. For example, the pixel SP may be arranged in a matrix, but is not limited thereto.

The touch layer is a layer sensing a touch input, and may perform a function of a touch member. The touch layer may include a plurality of touch electrodes (RX and TX of FIG. 3). The touch layer may determine whether a touch input has been made, and may calculate a corresponding position of the touch input as a touch input coordinate. A detailed description of the display layer and the touch layer will be given later.

The display panel 10 includes an active region AR and a non-active region NAR. When a portion for displaying an image is a display region, a portion for not displaying an image is a non-display region, and a region for sensing a touch input is a touch region, the display region and the touch region may be included in the active region AR.

The display region and the touch region may overlap each other. For example, the active region AR may be a region where an image is displayed and a touch input is also sensed. The active region AR may have a rectangular shape or a rectangular shape with rounded corners. For example, a rectangular shape in which the second direction Y is longer than the first direction X is illustrated as the active region AR. However, without limitation to this example, the active region AR may have a rectangular shape with rounded corners, in which the first direction X is longer than the second direction Y, a square shape, other polygonal shape, or various shapes such as a circular shape and an elliptical shape.

The non-active region NAR is disposed in the vicinity of the active region AR. The non-active region NAR may be in a bezel region. The non-active region NAR may at least partially surround by all sides of the active region AR. However, without limitation to this caw, the non-active region NAR may be disposed in the vicinity of only three sides of the active region AR. In this case, the other one side of the active region AR may constitute an edge of the display device 1.

A signal line for applying a signal to the active region AR (e.g., to the display region or touch region) or driving circuits may be disposed in the non-active region NAR. The non-active region NAR may not include a display region and a touch region. The non-active region NAR may be the same region as the non-display region in which an image is not displayed. In an embodiment of the present invention, the touch region may at least partially overlap the non-active region NAR.

For example, the display driving circuit 30 may be disposed in the non-active region NAR and adjacent to a lower side of the display panel 10. The display driving circuit 30 may be formed as an integrated circuit (IC), and may be attached to the non-active region NAR and disposed at the lower side of the display panel 10 in a chip on glass (COG) type, a chip on plastic (COP) type or an ultrasonic bonding type, but the present invention not limited thereto. For example, the display driving circuit 30 may be attached onto the circuit board 20.

The display driving circuit 30 may generate signals for driving the plurality of pixels SP of the display panel 10 by using a clock voltage and a data voltage, which are transferred rom a main circuit board through a plurality of conductive lines (221 of FIG. 2 and 212 of FIG. 3) of the circuit board 20.

The circuit board 20 may be disposed in the non-active region NAR and at an end portion of the lower side of the display panel 10. The circuit board 20 may be attached onto pad portions (DPA, TPA1 and TPA2 of FIG. 2) disposed in the non-active region NAR at the end portion of the lower side of the display panel 10 through a conductive adhesive member such as an anisotropic conductive film. The circuit board 20 may include a plurality of conductive lines 211 and 212 for transferring signals from the main circuit board to the display driving circuit 30 or electrically connecting the touch driving circuit 40 with a plurality of touch electrodes RE and TE of the touch layer. Hereinafter, the description will be based on that the circuit board 20 is a flexible circuit board that includes a flexible material, but the circuit board 20 may be a hard or rigid circuit board without being limited to the flexible circuit board.

The touch driving circuit 40 may be disposed on the circuit board 20. The touch driving circuit 40 may be formed as an integrated circuit and attached onto the circuit board 20 in a chip on film (COF) type. However, the present invention is not limited thereto. For example, the touch driving circuit 40 may be attached onto the non-display region of the display panel 10 in a chip on glass (COG) type, a chip on plastic (COP) type or an ultrasonic bonding type. In the present invention, for example, although the description is based on that the touch driving circuit 40 and the display driving circuit 30 are respectively formed as integrated circuits, the display driving circuit 30 and the touch driving circuit 40 may be formed to be integrated in one integrated circuit, as the case may be.

The touch driving circuit 40 may apply a current to the plurality of touch electrodes RE and TE of the touch layer or sense an electrical signal transferred from the plurality of touch electrodes RE and TE. In addition, the touch driving circuit 40 may determine whether a touch input has been made, by using the electrical signal transferred from the plurality of touch electrodes RE and TE, and may calculate the corresponding position of the touch input as a touch input coordinate. The touch driving circuit 40 may transfer the touch input coordinate to the main processor of the main circuit board through the plurality of conductive lines 211 and 212 of the circuit board 20.

Figure 3:
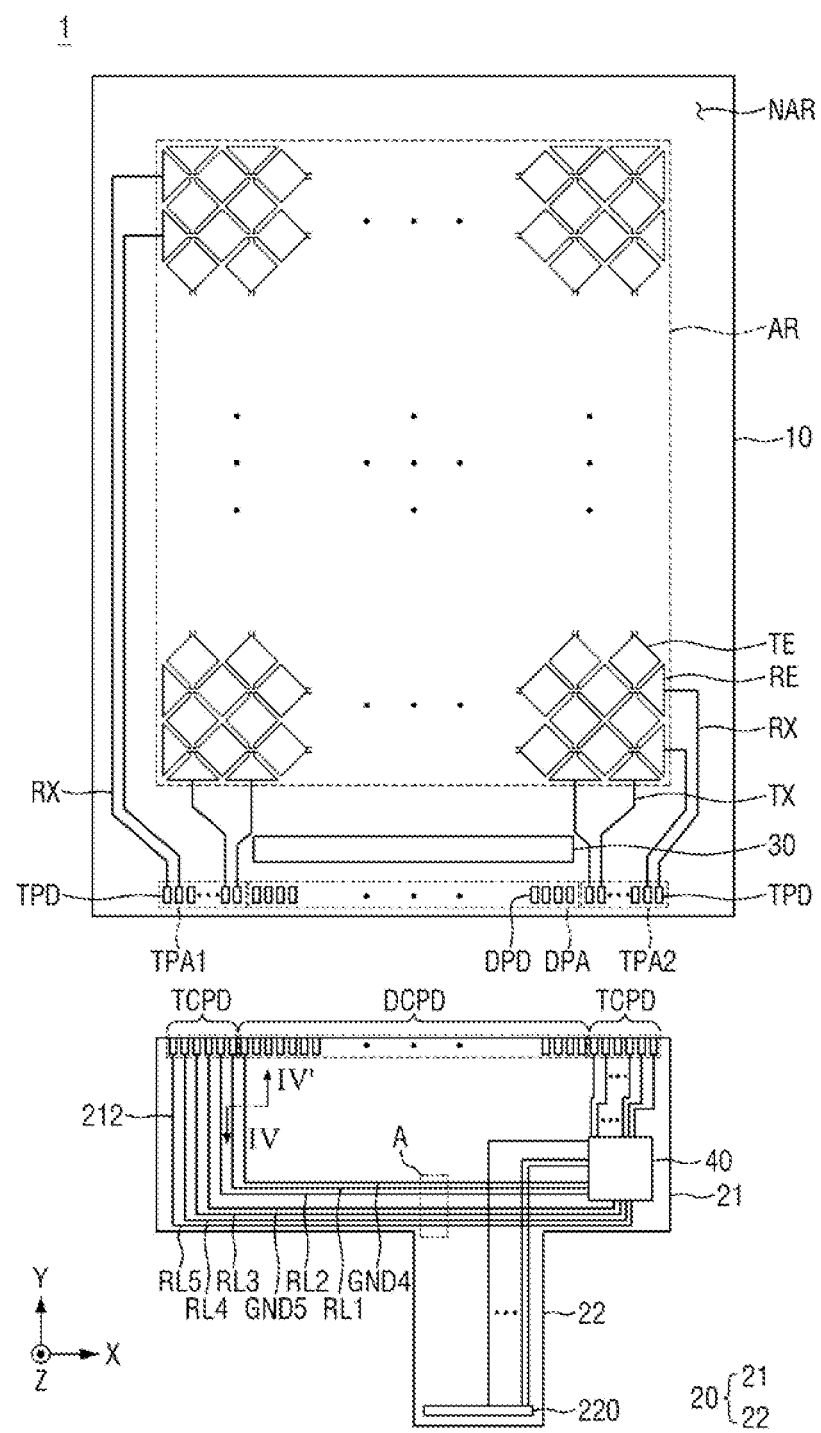
FIG. 3 is a schematic plane view illustrating an arrangement structure of a plurality of touch signal lines and a plurality of conductive lines of a circuit board according to an embodiment of the present inventive concept.

FIG. 2 is a schematic plane view illustrating an arrangement structure of a plurality of data signal lines and a plurality of conductive lines of a circuit board according to an embodiment of the present invention. FIG. 3 is a schematic plane view illustrating an arrangement structure of a plurality of touch signal lines and a plurality of conductive lines of a circuit board according to an embodiment of the present invention.

For convenience of description, FIGS. 2 and 3 illustrate a plurality of pixels SP, a plurality of scan lines SL, and a plurality of data signal lines DL of the display layer, and a plurality of touch electrodes RE and TE and a plurality of touch signal lines RX and TX of the touch layer. In addition, FIG. 2 shows a plurality of conductive lines 211 electrically connected with the display driving circuit 30 through a display pad portion DPA, and FIG. 3 shows a plurality of conductive lines 212 electrically connected with the touch signal lines RX and TX through the touch pad portions TPA1 and TPA2.

The display panel 10 may include a display layer and a touch layer disposed on the display layer as described above. In the present invention, a touch member is integrated in the display panel 10 in the form of a touch layer, but the present invention is not limited thereto. For example, the touch member may be provided as a panel or film separate from the display panel 10 and attached onto the display panel 10.

Referring to FIG. 2, the display layer may include a plurality of pixels SP, a plurality of scan lines SL, and a plurality of data signal lines DL, wherein the scan lines SL and the data signal lines DL are respectively connected to the plurality of pixels SP.

Each of the plurality of pixels SP may include a light emitting diode for displaying an image, and a plurality of thin film transistors for driving the light emitting diode. The plurality of thin film transistors may include a driving transistor and a switching transistor. The driving transistor is for controlling a current flowing in the light emitting diode, and the switching transistor serves as a switching element. Each of the plurality of pixels SP may be connected to at least one of the plurality of scan lines SL and any one of the plurality of data signal lines DL.

The plurality of scan lines SL may be extended from the scan driver 50 disposed in the non-active region NAR at one side of the display panel 10 in the first direction X. The scan driver 50 may receive a scan control signal from the display driving circuit 30 through a scan control line SCL, and thus may generate a scan signal to apply the scan signal to the plurality of scan lines SL. The plurality of scan lines SL may transfer the scan signal applied from the scan driver 50 to each of the plurality of pixels SP. The scan driver 50 may tom-on and turn-off of the switching transistor through the plurality of scan lines SL.

The plurality of data signal lines DL may be extended in the second direction Y. The plurality of data signal lines DL may be connected with the display driving circuit 30 through a fen-out lines FL, respectively. Data signals generated in the display driving circuit 30 may respectively be applied to the plurality of data signal lines DL through the fan-out lines FL. The display driving circuit 30 may control the amount of emission of the light emitting diode through the plurality of data signal lines DL. For example, the data signals of the plurality of data signal lines DL may be applied to a gate electrode of the driving transistor to control a value of a current flowing in the light emitting diode.

Referring to FIG. 3, the touch layer may include a plurality of touch electrodes RE and TE and a plurality of touch signal lines RX and TX connected to the plurality of the touch electrodes RE and TE. The touch layer may receive an electrical signal from the touch driving circuit 40 disposed on the circuit board 20 through the plurality of touch signal lines RX and TX, or may sense a touch input by transmitting the electrical signal sensed by the plurality of touch electrodes RE and TE to the touch driving circuit 40 through the plurality of touch signal lines RX and TX.

The touch layer may include a touch region, in which a touch input is sensed, and a n-touch region adjacent to the touch region. The plurality of touch electrodes RE and TE may be disposed in the touch region, and the plurality of touch signal lines RX and TX may be disposed in the non-touch region.

The plurality of touch electrodes RE and TE may include a plurality of driving electrodes TE and a plurality of sensing electrodes RE. The plurality of touch signal lines RX and TX nay include a plurality of touch driving lines TX and a plurality of touch sensing lines RX.

The plurality of touch electrodes RE and TE may include a surface type pattern made of a transparent conductive layer or a mesh type pattern to which an opaque metal is applied along a region in which the light emitting diode is not disposed, to not disturb movement of light emitted from the display layer.

The touch driving signal from the touch driving circuit 40 may be applied to each of the plurality of driving electrodes TE through any one of the plurality of touch driving lines TX. Mutual capacitance may be formed between the driving electrode TE and the sensing electrode RE, which are adjacent to each other. When an external touch input occurs, a value of mutual capacitance between the driving electrode TE and the sensing electrode RE, which are adjacent to each other, may be changed. The change of mutual capacitance measured in the plurality of sensing electrodes RE may be transferred to the touch driving circuit 40 through the plurality of touch sensing lines RX. Therefore, the touch driving circuit 40 may determine whether a touch input has been made, and may calculate the corresponding position of the touch input as a touch input coordinate. The touch sensing may be made by a mutual capacitance type, but the present invention is not limited thereto.

Referring to FIGS. 2 and 3, the pad portions DPA, TPA1 and TPA2 may be disposed in the non-active region NAR and at the end portion of the lower side of the display panel 10. The pad portions DPA, TPA1 and TPA2 may include a display pad portion DPA and touch pad portions TPA1 and TPA2. The display pad portion DPA and the touch pad portions TPA1 and TPA2 may be electrically connected to the circuit board 20 through a conductive adhesive member such as an anisotropic conductive film.

The display pad portion DPA may include display pads DPD disposed in the display pad portion DPA disposed between the touch pad portions TPA1 and TPA2 and connected with the display driving circuit 30 through as plurality of display signal lines DSL. The plurality of display signal lines DSL may include a plurality of data voltage lines, a ground connection line, and a clock voltage line for generating a scan control signal. The plurality of data voltage lines are for transmitting a plurality of data signals from the display driving circuit 30.

The touch pad portions TPA1 and TPA2 may include a first touch pad portion TPA1 and a second touch pad portion TPA2. The first touch pad portion TPA1 and the second touch pad portion TPA2 may respectively be disposed at both sides of the display pad portion DPA in the first direction X. For example, the first touch pad portion TPA1 may be disposed at a left side of the display pad portion DPA, and the second touch pad portion TPA2 may be disposed at aright side of the display pad portion DPA.

The first touch pad portion TPA1 and the second touch pad portion TPA2 may include touch pads TPD connected with any one of the plurality of touch driving lines TX or any one of the plurality of touch sensing lines RX. In FIG. 3, the touch pad portions TPA1 and TPA2 include the first touch pad portion TPA1 and the second touch pad portion TPA2, and the first touch pad portion TPA1 and the second touch pad portion TPA2 are respectively disposed at both sides of the display pad portion DPA, but the present invention is not limited thereto. For example, the touch pad portions TPA1 and TPA2 may be formed only at one side of the display pad portion DPA.

The circuit board 20 may include a body portion 21 and a tail portion 22. The tail portion 22 of the circuit board 20 may be connected with the main circuit board, but the present invention is not limited thereto. For example, the circuit board 20 may include the body portion 21, and may be connected with the main circuit board through a separate cable.

The body portion 21 may have a rectangular shape in which a width of the first direction X is greater than that of the second direction Y on the plane. The width of the first direction X of the body portion 21 may be smaller than that of the first direction X of the display panel 10. The tail portion 22 may have a shape protruded from an end portion of a lower side of the body portion 21. The tail portion 22 may have a rectangular shape in which a width of the second direction Y is greater than that of the first direction X. The width of the first direction X of the tail portion 22 may be smaller than that of the first direction X of the body portion 21. However, the embodiments of the present invention are not limited to these examples. For example, each of the body portion 21 and the tail portion 22 of the circuit board 20 may have a shape in which one side is inwardly recessed or protruded, or may have a hole in at least a region. In this way, various modifications may be made to the shape of the circuit board 20.

The circuit board 20 may include a plurality of connection pads TCPD and DCPD, which are electrically connected with each of the display pads DPD and the touch pads TPD of the display panel 10, and a plurality of conductive lines 211 and 212. The plurality of connection pads TCPD and DCPD may include display connection pads DCPD and touch connection pads TCPD. The display connection pads DCPD are connected with the display pads DPD of the display panel 10, and touch connection pads TCPD are connected with the touch pads TDP of the display panel 10.

The circuit board 20 may include a coupling member 220 disposed at an end portion of a lower side of the tail portion 22. The coupling member 220 may be, but is not limited to, a connector for being connected with the main circuit board.

The plurality of conductive lines 211 and 212 may include a plurality of first conductive lines 211 and a plurality of second conductive lines 212. The plurality of first conductive lines 211 may be conductive lines connected with the display connection pads DCPD, and the plurality of second conductive lines 212 may be conductive lines connected with the touch connection pads TCPD.

The plurality of first conductive lines 211 and the plurality of second conductive lines 212 may be formed on their respective layers that are different from each other. In this case, the plurality of first conductive lines 211 and the plurality of second conductive lines 212 may at least partially overlap each other in the third direction Z. However, without limitation to this case, for example, a portion of the plurality of first conductive lines 211 and a portion of the plurality of second conductive lines 212 may be formed on the same layer in a portion of the circuit board 20 on the plane.

A portion of the plurality of first conductive lines 211, as shown in FIG. 2, may be extended from the body portion 21 in an opposite direction of the second direction Y and may be extended in the first direction X. The portion of the plurality of first conductive lines 211 may also be again extended in the opposite direction of the second direction Y and then disposed in the tail portion 22. For example, at least one of the plurality of first conductive lines 211 includes a first portion extending in the opposite direction of the second direction Y, a second portion connected to the first portion and extending in the first direction X, and a third portion connected to the second portion and extending in the opposite direction of the second direction Y. Therefore, the plurality of first conductive lines 211 may be electrically connected with the main circuit board through the coupling member 220.

In addition, the plurality of second conductive lines 212 disposed at a left region of the circuit board 20, as shown in FIG. 3, may be extended from the body portion 21 in the opposite direction of the second direction Y and may be extended in the first direction X. In addition, the plurality of second conductive lines 212 may be connected with the touch driving circuit 40 or extended in the second direction Y and then connected with the touch driving circuit 40. For example, the plurality of second conductive lines 212 may include a first portion extending from the body portion 21 in the opposite direction of the second direction Y, and a second portion connected to the first portion and extending in the first direction X. Further, the second portion may be connected to the touch driving circuit 30, or the second conductive line 212 may include a third portion extending in the second direction Y and connected with the touch driving circuit 40 and the second portion. However, the extended directions of the plurality of conductive lines 211 and 212 are shown in FIGS. 2 and 3 for convenience of description, and the embodiments of the present are not limited thereto. Various modifications may be made in the extended directions of the plurality of conductive lines 211 and 212.

Figure 4:
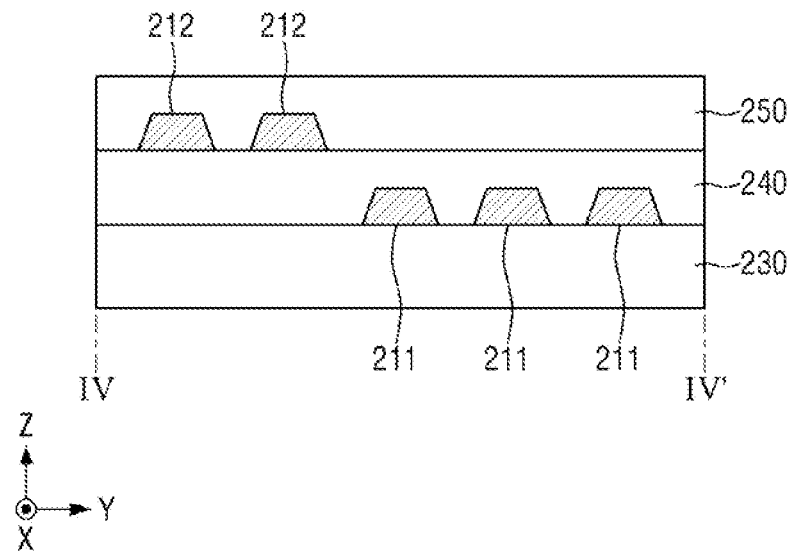
FIG. 4 is a sectional view illustrating a circuit board taken along line IV-IV' of FIGS. 2 and 3.

FIG. 4 is a sectional view illustrating a circuit board taken along line IV-IV' of FIGS. 2 and 3.

The circuit board 20 may include a base substrate 230, a plurality of first conductive lines (or first conductive layer) 211 disposed on the base substrate 230, a first insulating layer 240 disposed on the plurality of first conductive lines 211, a plurality of second conductive lines (or second conductive layer) 212 disposed on the first insulating layer 240, and a second insulating layer 250 disposed on the second conductive lines 212.

The base substrate 230 may be formed of a flexible material. For example, the base substrate 230 may include any one of Polyimide, Polyester, Poly phenylene vinylene, and Polyethylene terephthalate (PET), but the present invention is not limited thereto. Therefore, the circuit board 20 may be curved or folded.

The plurality of first conductive lines 211 may be disposed on the base substrate 230. Each of the plurality of first conductive lines 211 may include a metal material such as Cu, Ag, Ni, and W. For example, the plurality of first conductive lines 211 may be formed through a photoresist (PR) process after a metal film is stacked or deposited on the base substrate 230, or may be formed through a metal plating process on the base substrate 230. However, the method of forming the plurality of first conductive lines 211 is not limited to the above example.

The first insulating layer 240 may be disposed on the base substrate 230 and the plurality of first conductive lines 211. For example, the first insulating layer 240 may cover the plurality of first conductive lines 211. The first insulating layer 240 may prevent oxygen or water from being permeated into the plurality of first conductive lines 211. For example, the first insulating layer 240 may include an insulating material having a flexible property. For example, the first insulating layer 240 may include polyimide, but the present invention is not limited thereto. The first insulating layer 240 may serve as an insulating layer that electrically insulates the plurality of first conductive lines 211 or electrically insulates the plurality of first conductive lines 211 from the plurality of second conductive lines 212. In this case, the first insulating layer 240 may have a property as a dielectric. In addition, the first insulating layer 240 may be a layer on which the plurality of second conductive lines 212 are formed.

The plurality of second conductive lines 212 may be disposed on the first insulating layer 240. Each of the plurality of second conductive lines 212 may include a metal material such as Cu, Ag, Ni, and W. A method of forming the plurality of second conductive lines 212 may be substantially the same as the method of forming the plurality of first conductive lines 211.

The second insulating layer 250 may be disposed on the first insulating layer 240 and the plurality of second conductive lines 212. For example, the second insulating layer 250 may cover the plurality of second conductive lines 212. The second insulating layer 250 may prevent oxygen or water from being permeated into the plurality of second conductive lines 212. For example, the second insulating layer 250 may include an insulating material having a flexible property. For example, the second insulating layer 250 may include polyimide, but the present invention is not limited thereto. The second insulating layer 250 may serve as an insulating layer that electrically insulates the plurality of second conductive lines 212. In this case, the second insulating layer 250 may have a property as a dielectric.

There is no limitation in a spaced width between the plurality of first conductive lines 211 and a spaced width between the plurality of second conductive lines 212, but it is desirable to have a spaced width that may stably make electrical insulation between the respective conductive lines 211 and 212.

Each of the plurality of first conductive lines 211 and the plurality of second conductive lines 212 may be formed as a single layer, but the present invention is not limited thereto. Each of the plurality of first conductive lines 211 and the plurality of second conductive lines 211 may be formed as multiple layers. In this case, each of the plurality of first conductive lines 211 and the plurality of second conductive lines 212 may further include layers such as a barrier layer or capping layer for protecting the conductive lines 211 and 212 from the outside, to perform another function in addition to signal transfer.

The plurality of first conductive lines 211 and the plurality of second conductive lines 212 might not overlap each other, in the third direction Z, in a region of the circuit board 20.

Figure 5:
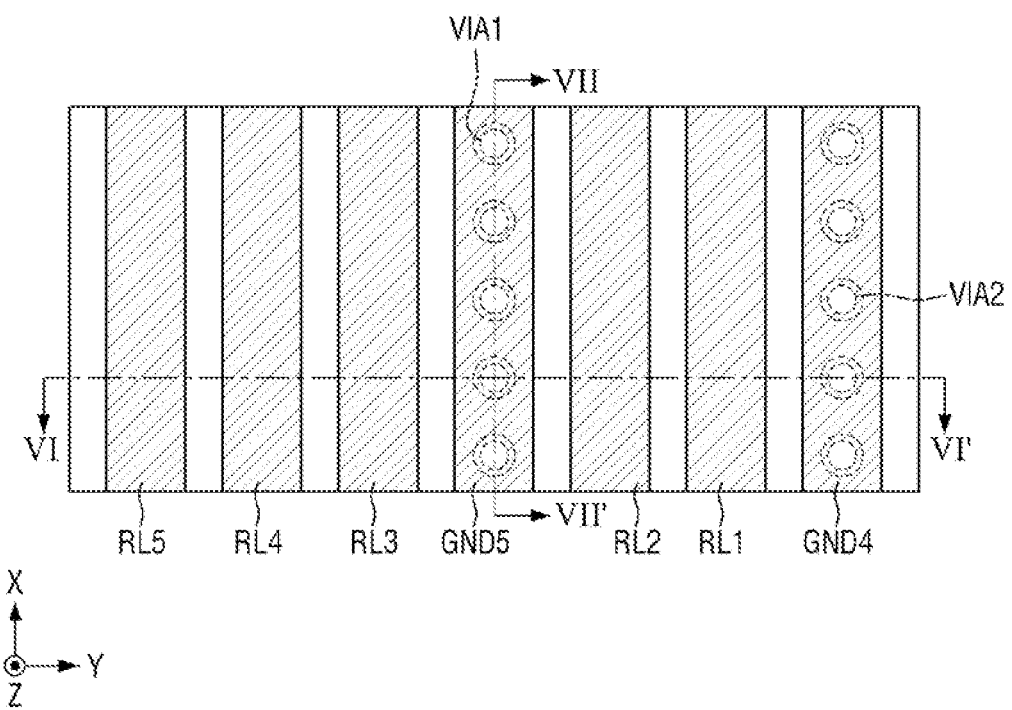
FIG. 5 is an enlarged view illustrating a region A of FIGS. 2 and 3.
Figure 6:
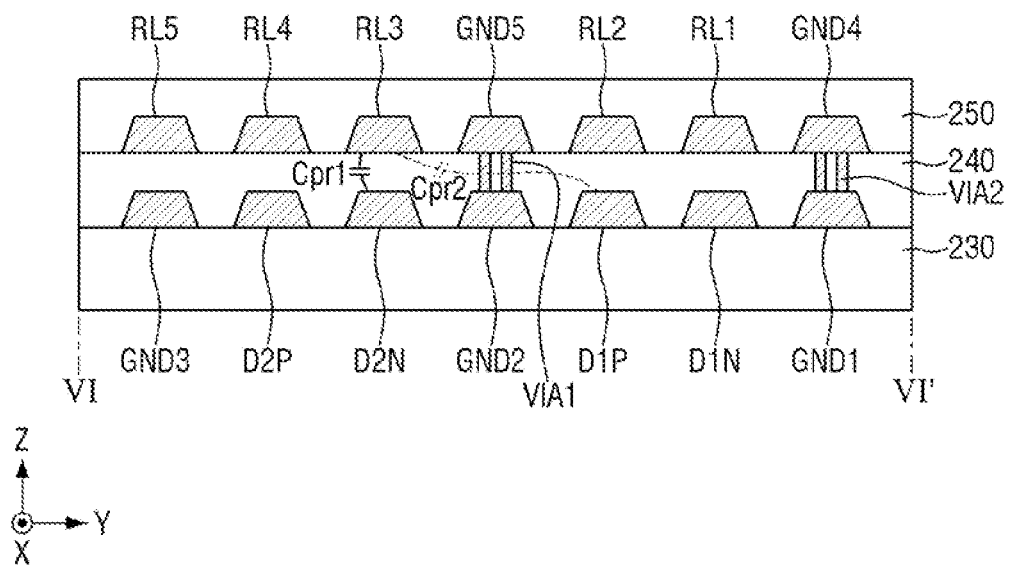
FIG. 6 is a sectional view illustrating a circuit board taken along line VI-VI' of FIG. 5.
Figure 7:
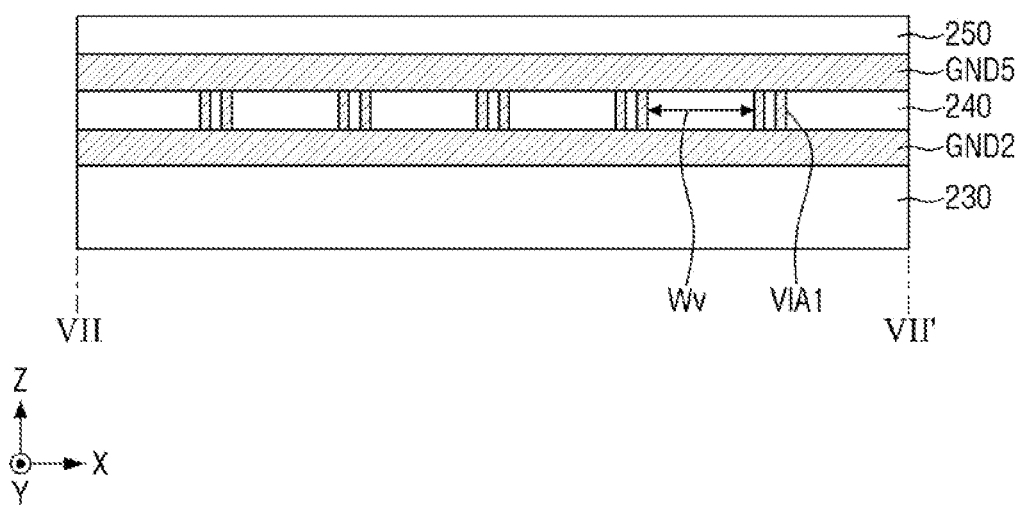
FIG. 7 is a sectional view illustrating a circuit board taken along line VII-VII' of FIG. 5.

FIG. 5 is an enlarged view illustrating a region A of FIGS. 2 and 3. FIG. 6 is a sectional view illustrating a circuit board taken along line VI-VI' of FIG. 5. FIG. 7 is a sectional view illustrating a circuit board taken along line V-VII' of FIG. 5.

For convenience of description, among the plurality of first conductive lines 211, conductive lines to which da voltages for generating data signals in the display driving circuit 30 are applied and conductive lines to which a ground voltage is applied are illustrated in FIGS. 5 to 7. The conductive lines to which the data voltages are applied will be referred to as data lines, and the conductive lines to which the ground voltage is applied will be referred to as ground lines.

In addition, among the plurality of second conductive lines 212, conductive lines connected with the touch sensing line RX through the touch connection pad TCPD, that is, the conductive lines for transferring the touch sensing signal to the touch driving circuit 40, and the conductive lines to which the ground voltage is applied are illustrated in FIGS. 5 to 7. The conductive lines connected with the touch sensing line will be referred to as touch lines.

The plurality of data lines may include a plurality of low voltage data lines and a plurality of high voltage data lines. The display driving circuit 30 may use a differential mode in generating a data signal. For example, the data signal for being applied to one data signal line DL nay be generated using a difference between two waveforms. Therefore, the display driving circuit 30 may generate one dam signal by using any one of the plurality of low voltage lines and any one of the plurality of high voltage lines, and may apply the data signal to any one of the plurality of data signal lines DL.

Referring to FIGS. 5 to 7, the plurality of first conductive lines 211 and the plurality of second conductive lines 212 may be disposed to be more adjacent to each other in at least a first region of the circuit board 20 than in the other regions of the circuit board 20. In this case, the circuit board 20 may further include a plurality of vias VIA that include a conductive material to prevent signal interference between the plurality of first conductive lines 211 and the plurality of second conductive lines 212 from occurring.

The plurality of first conductive lines 211 disposed on the base substrate 230 may include a first ground line GND1, a second ground line GND2, a third ground line GND3, a first low voltage data line D1N, a first high voltage data line D1P, a second low voltage data line D2N, and a second high voltage data line D2P. The first low voltage data line D1N and the first high voltage data line D1P may be lines to which waveforms for generating a data signal, which is applied to any one of the plurality of data signal lines DL, are respectively applied, and the second low voltage data line D2N and the second high voltage data line D2P may be lines to which waveforms for generating a data signal, which is applied to another one of the plurality of data signal lines DL, are respectively applied.

The first ground line GND1, the second ground line GND2, and the third ground line GND3 may be disposed between two pairs of data lines to reduce signal interference between the data lines. For example, the third ground line GND3, the second high voltage data line D2P, the second low voltage dam line D2N, the second ground line GND2, the first high voltage data line D1P, the first low voltage data line D1N, the first ground line GND1 may be arranged in the second direction Y in due order. Through this arrangement, signals respectively applied to the first high voltage data line D1P and the first low voltage data line D1N and signals respectively applied to the second high voltage data line D2P and the second low voltage data line D2N may be prevented from mutually interfering with each other. However, without limitation to this cam, one ground line may be formed per four data lines.

The plurality of second conductive lines 212 disposed on the first insulating layer 240 may include a first touch line RL1, a second touch line RL2, a third touch line RL3, a fourth touch line RL4, a fifth touch line RL5, a fourth ground line GND4, and a fifth ground line GND5. The fourth ground line GND4 and the fifth ground line GND5 may be ground lines formed to at least partially overlap any one of the first to third ground lines GND1 to GND3 in the third direction Z.

The plurality of first conductive lines 211 and the plurality of second conductive lines 212 may overlap each other in a region A of the circuit board 20 in the third direction Z. For example, the third ground line GND3 may overlap the fifth touch line RL5. The second high voltage data line D2P may overlap the fourth touch line RL4. The second low voltage dam line D2N may overlap the third touch line RL3. The second ground line GND2 may overlap the fifth ground line GND5. The first high voltage dam line D1P may overlap the second touch line RL2. The first low voltage data line D1N may overlap the first touch line RL1, and the first ground line GND1 may overlap the fourth ground line GND4.

The plurality of first conductive lines 211 and the plurality of second conductive lines 212 may electrically be insulated from each other by the first insulating layer 240. However, since the first insulating layer 240 has a dielectric property, a parasitic capacitor may be formed between the plurality of first conductive lines 211 and the plurality of second conductive lines 212. For example, although a signal flowing in each of the plurality of first conductive lines 211 and a signal flowing in each of the plurality of second conductive lines 212 may be controlled independently, the signals respectively applied to the plurality of first conductive lines 211 and the plurality of second conductive lines 212 may be mutually coupled to each other by the parasitic capacitor and thus may affect each other.

As an example, a first parasitic capacitor Cpr1 may be formed between the third touch line RL3 and the second low voltage data line D2N that overlaps the third touch line RL3 in the third direction Z. In addition, a second parasitic capacitor Cpr2 may be formed between the third touch line RL3 and the first high voltage data line D1P. Although the first parasitic capacitor Cpr1 between the third touch line RL3 and the second low voltage data line D2N and the second parasitic capacitor Cpr2 between the third touch line RL3 and the first high voltage data line D1P are only illustrated in FIG. 6, a parasitic capacitor may be formed between the third touch line RL3 and the second high voltage data line D2P and between the third touch line RU and the first low voltage data line D1N.

The third touch line RL3 may be connected with any one of the plurality of touch sensing lines RX of the touch layer to transfer the touch sensing signal to the touch driving circuit 40. A change of the touch sensing signal may be relatively smaller than that of another signal (for example, a data signal, a clock signal, or the like). Therefore, a change of the signal flowing in the second low voltage data line D2N and a change of the signal flowing in the first high voltage data line D1P may be reflected in a signal flowing in the third touch line RL3 due to the first parasitic capacitor Cpr1 and the second parasitic capacitor Cpr2, respectively.

For thia reason, the touch sensing signal transferred to the touch driving circuit through the third touch line RL3 may differ from a voltage change of the plurality of sensing electrodes RE of the touch layer. This difference may be increased even by a cumulative influence caused by the parasitic capacitor formed between the third touch line RL3 and its adjacent line on the same layer and the parasitic capacitor formed between the third touch line RL3 and the first conductive lines 211 spaced apart from the third touch line RL3 at a relatively long distance.

However, according to embodiment of the present invention, the plurality of vias VIA may be disposed between the first ground line GND1 and the fourth ground line GND4 and between the second ground line GND2 and the fifth ground line GND5, whereby the above influence caused by the parasitic capacitor may be reduced.

For example, the plurality of vias VIA may be formed in such a manner that a plurality of via holes am formed after the first insulating layer 240 is disposed, and the plurality of second conductive lines 212 are disposed after inner walls of the plurality of via holes are subjected to plating. However, the method of forming the plurality of vias VIA is not limited to this method, and for example, the plurality of vias VIA may be formed through various methods. For example, the plurality of vias VIA may be formed in such a manner that the inner walls of the plurality of via holes are subjected to plating after the plurality of second conductive lines 212 are formed on the first insulating layer 240 and a plurality of via holes passing through the second conductive lines 212 and the first insulating layer 240 are formed.

A metal for forming the plurality of vias VIA may include a metal material such as Cu, Ag, Ni and W. The metal for forming the plurality of vias VIA may substantially be the same as the metal constituting the plurality of first conductive lines 211 and the plurality of second conductive lines 212, but the present invention is not limited thereto.

Inner regions of the plurality of vias VIA may be filled with an insulating material or air. However, even in this case, the inner regions of the plurality of vias VIA may be disconnected from the first insulting layer 240 by the metal material of forming the plurality of vias VIA, and a ground voltage may be applied to the metal forming the plurality of vias VIA. For example, the inner regions of the plurality of vias VIA may be between the metal material that forms the plurality of vias VIA.

The plurality of vias VIA may include an inner side and an outer side, each of which has a closed figure shape on a plan view. The inner side and the outer side of each of the plurality of vias VIA may have a circular shape; however, the present invention is not limited thereto, and for example, the plurality of vias VIA may have a polygonal shape. For example, the plurality of via VIA may have an annular shape on the plane view, but the present invention is not limited thereto. Each of the inner side and the outer side of each of the plurality of via VIA may have various shapes of a polygonal shape, such as a rectangular shape, a square shape, a triangular shape, and a pentagonal shape, or an elliptical shape.

The first ground line GND1 and the fourth ground line GND4 may be connected with each other by a plurality of second vias VIA2, and the second ground line GND2 and the fifth ground line GND5 may be connected with each other by a plurality of first vias VIA1. Hereinafter, for convenience of description, although the description will be given based on the second ground line GND2, the fifth ground line GND5, and the plurality of first vias VIA1, the plurality of second vias VIA2 may have substantially the same structure and function as those of the plurality of first vias VIA1.

The second ground line GND2 and the fifth ground line GND5 may be connected with each other by the plurality of first vias VIA1, thereby having the same ground voltage value. In this case, the ground voltage may be 0V, but the present invention is not limited thereto. For example, the ground voltage may be a reference voltage having a specific voltage value not 0.

Since the second ground line GND2 and the fifth ground line GND5 are electrically connected with each other through the plurality of first via VIA1, the second ground line GND2 and the fifth ground line GND5 may be understood as one ground line that includes the plurality of via VIA1.

The first conductive line 211 and/or the second conductive line 212, which are(is) positioned at one side of one ground line that includes the plurality of first vias VIA1, may not cross the first conductive line 211 and/or the second conductive line 212, which are(is) positioned at the other side of the one ground line that includes the plurality of first vims VIA1. For example, the first conductive line 211, which is positioned at a first side of a ground line that includes the plurality of vims VIA, may not cross another first conductive line 211, which is positioned at a second side, opposite to the first side, of the ground line that includes the plurality of first vis VIA1.

The circuit board 20 according to an embodiment of the present invention may include the plurality of first vias VIA1 electrically connecting the second ground line GND2 with the fifth ground line GND5 to each other, thereby reducing density of the dielectric material (e.g., the first insulating layer 240) between the third touch line RL3 and the first high voltage data line D1P. For example, a capacitance value of the second parasitic capacitor Cpr2 between the third touch line RL3 and the first high voltage data line D1P may be reduced. Therefore, the signal flowing in the first high voltage data line D1P may be less reflected in the signal flowing in the third touch line RL3.

In addition, the plurality of first vies VIA1 may reduce a capacitance value between the third touch line RL3 and the first low voltage data line D1N. For example, the plurality of first vias VIA1 between the second ground line GND2 and the fifth ground line GND5 may reduce the capacitance value between the third touch line RL3 and the first conductive lines 211 spaced apart from the third touch line RL3 in the second direction Y and third direction Z, thereby reducing cumulative reflection of the signals, which flow in the first conductive lines 211 spaced apart from the third touch line RL3 in the second direction Y and third direction Z, in the signal flowing in the third touch line RL3.

Accordingly, the circuit board 20 according to an embodiment of the present invention may include the plurality of vias VIA electrically connecting the first conductive line 211, to which the ground voltage is applied, with the second conductive line 212, to which the ground voltage is applied, in the third direction Z, thereby reducing the parasitic capacitance value between the plurality of touch lines and the plurality of data lines, which are respectively disposed at both sides of the plurality of vias VIA. As a result, it may be possible to reduce cumulative refection of the signals flowing in the plurality of data lines in the touch lines. Therefore, the touch driving circuit 40 may have increased accuracy in determining whether a touch input has been made, and may have increased accuracy in calculating the corresponding position of a touch input as a touch coordinate.

The plurality of first visa VIA1 may be disposed to be spaced apart from one another along the extended direction of the second ground line GND2 and the fifth ground line GND5. The plurality of first vies VIA1 may be disposed to be spaced apart from one another at substantially the sane interval, but the present invention is not limited thereto. As the case may be, the spaced intervals between the plurality of first vim VIA1 may be different may be different from one another. However, the description will be given based on that the plurality of first via VIA1 are disposed to be spaced apart from one another at the same spaced interval.

A diameter of the outer side of each of the plurality of first vias VIA1 may be about ½ or more of a line width of each of the second ground line GND2 and the fifth ground line GND5. In an embodiment of the present invention, the diameter of the outer side of each of the plurality of first vias VIA1 may be about ½ to about ¾ of the line width of each of the second ground line GND2 and the fifth ground line GND5, but the present invention is not limited thereto.

The greater the diameter of the outer side of each of the plurality of first vias VIA1 is, the smaller a size of the parasitic capacitance formed between the first high voltage data line D1P and the third touch line RL3 may be, and the signal flowing in the third touch line RL3 may be relatively stable.

The influence of the change of the signal flowing in the first high voltage data line D1P on the third touch line RL3 may be proportional to a size of the spaced width between the plurality of first vias VIA1. For example, the smaller the spaced width (e.g., spaced interval) between the plurality of first vias VIA1 is, the smaller the size of the parasitic capacitance formed between the first high voltage data line D1P and the third touch line RL3 is, and the signal flowing in the third touch line RL3 may be relatively stable. The spaced width between the plurality of first vias VIA1 may be about 0.2 mm or less. In an embodiment of the present invention, it may be desirable that the spaced width between the plurality of first vias VIA1 is formed to be about 0.04 mm or less.

Figure 8:
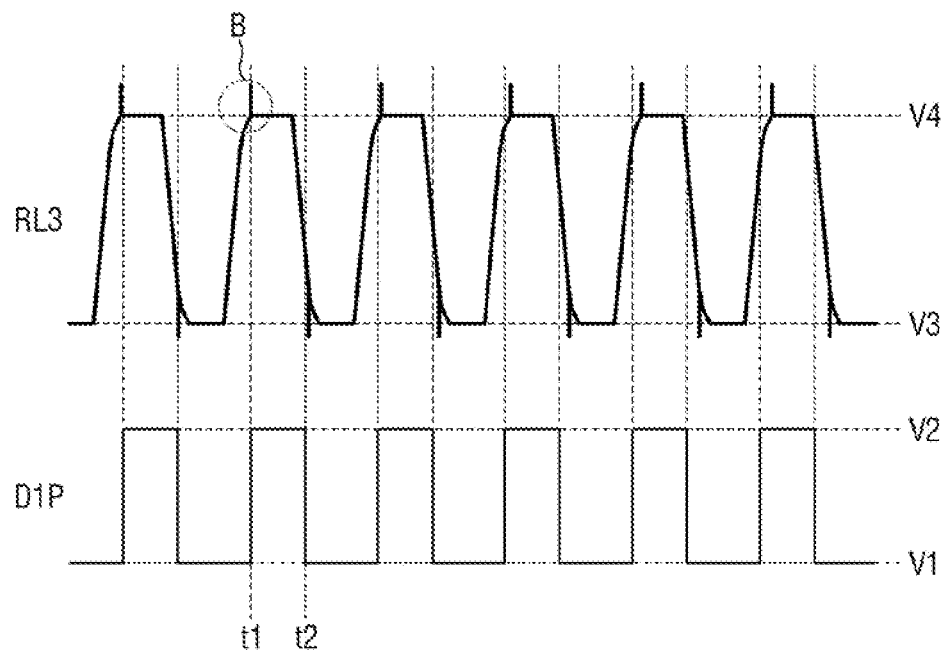
FIG. 8 is a waveform illustrating an influence of a signal applied to a first high voltage data line of FIG. 5 on a third touch line.
Figure 9:
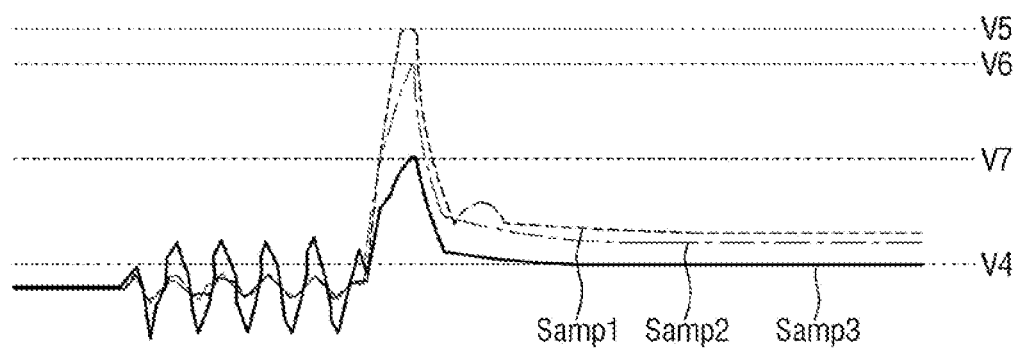
FIG. 9 is an enlarged view illustrating a region B of FIG. 8.

FIG. 8 is a waveform illustrating an influence of the signal applied to the first high voltage data line D1P of FIG. 5 on the third touch lie RL3. FIG. 9 is an enlarged view illustrating a region B of FIG. 8.

In FIG. 8, for convenience of description, the signal applied to the first high voltage data line D1P and the signal flowing in the third touch line RL3 have waveforms of the substantially same timing, but the present invention is not limited thereto.

Referring to FIG. 8, the signal applied to the first high voltage data line D1P may have a first voltage V1, which is a low voltage, and a second voltage V2, which is a high voltage. For example, the first voltage V1 may be, but is not limited to, 0V, and the second voltage V2 may be, but is not limited to, about 1.2V.

The signal flowing in the third touch line RL3 may have a third voltage V3, which is a low voltage, and a fourth voltage V4, which is a high voltage. For example, the third voltage V3 may be, but is not limited to, about 0.045V, and the fourth voltage V4 may be, but is not limited to, about 0.045V.

A difference between the high voltage and the low voltage of the first high voltage data line D1P, that is, a difference between the second voltage V2 and the first voltage V1 may be greater than a difference between the fourth voltage V4 and the third voltage V3 of the third touch line RL3. Therefore, a voltage change of the signal applied to the first high voltage data line D1P may be reflected in the signal flowing in the third touch line RL3 by the second parasitic capacitor Cpr2.

For example, when the voltage of the first high voltage data line D1P is changed from the first voltage V1 to the second voltage V2 at a first time period t1, the signal flowing in the third touch line RL3 may be affected by the voltage change of the first high voltage data line D1P and thus its voltage may be boosted at the first time period t1 like in the region B. On the contrary, when the voltage of the first high voltage data line D1P is changed from the second voltage V2 to the first voltage V1 at a second time period t2, the voltage of the signal flowing in the third touch line RL3 may be dropped at the second time period t2.

A voltage magnitude of the signal flowing in the third touch line RL3 illustrated in FIG. 8, which is boosted at the first time period t1 and dropped at the second time period t2, may be determined by cumulative reflection of the voltage change of the first high voltage data line D1P and the voltage change of each of the other data lines such as the first low voltage data line D1N, the second low voltage data line D2N and the second high voltage data line D2P.

FIG. 9 is a view illustrating a change of an influence of the signal applied to the first high voltage data line D1P on the third touch line RL3 based on the spaced width between the plurality of first vias VIA1.

Referring to FIG. 9, a first sample Samp1 shows a voltage change measured when the plurality of first vim VIA awe not formed between the third touch line RL3 and the first high voltage data line D1P. A second sample Samp2 shows a voltage change measured when the plurality of first vias VIA are formed between the third touch line RL3 and the first high voltage data line D1P and the spaced width between the plurality of first vias VIA1 is 0.2 mm, approximately. A third sample Samp3 shows a voltage change measured when the plurality of first vias VIA1 are formed between the third touch line RL3 and the first high voltage data line D1P and the spaced width between the plurality of first vim VIA is 0.04 mm, approximately.

In an embodiment of the preset invention, line widths of the third touch line RL3, the first high voltage data line D1P, the second ground line GND2 and the fifth ground line GND5 of each of the first to third samples Samp1 to Samp3 may be substantially equal to one another. For example, the line width of each of the third touch line RL3, the first high voltage data line D1P, the second ground line GND2 and the fifth ground line GND5 may be about 0.05 mm to about 0.5 mm, but the present invention is not limited thereto. In an embodiment of the present invention, the line widths of the third touch line RL3, the first high voltage data line D1P, the second ground line GND2 and the fifth ground line GND5 may be different from one another.

Among the voltages of the third touch line RL3 based on the first sample Samp1, the greatest voltage value in the region B may have a fifth voltage V5 greater than about 0.045V. Among the voltages of the third touch line RL3 based on the second sample Samp2, the greatest voltage value in the region B may have a sixth voltage V6 greater than about 0.045V and smaller than the fifth voltage V5. The greatest voltage value in the region B based on the third sample Samp3 may have a seventh voltage V7 greater than about 0.045V and smaller than the fifth voltage V5 and the sixth voltage V6. In this case, for example, the fifth voltage V5 may be 0.06V, approximately, the sixth voltage V6 may be 0.057V, approximately, and the seventh voltage V7 may be 0.053V, approximately.

For example, when the plurality of first vim VIA1 are formed between the third touch line RL3 and the first high voltage data line D1P, the voltage change of the signal applied to the first high voltage data line D1P reduces a voltage magnitude reflected in the third touch line RL3 more than the case that the plurality of first vias VIA1 are not formed between the third touch line RL3 and the first high voltage data line D1P. In addition, when the plurality of first vias VIA1 are formed between the third touch line RL3 and the first high voltage data line D1P, as the spaced width between the plurality of first vias VIA1 becomes smaller, the voltage magnitude reflected in the third touch line RL3 reduces due to the voltage change of the signal applied to the first high voltage data line D1P.

Figure 10:
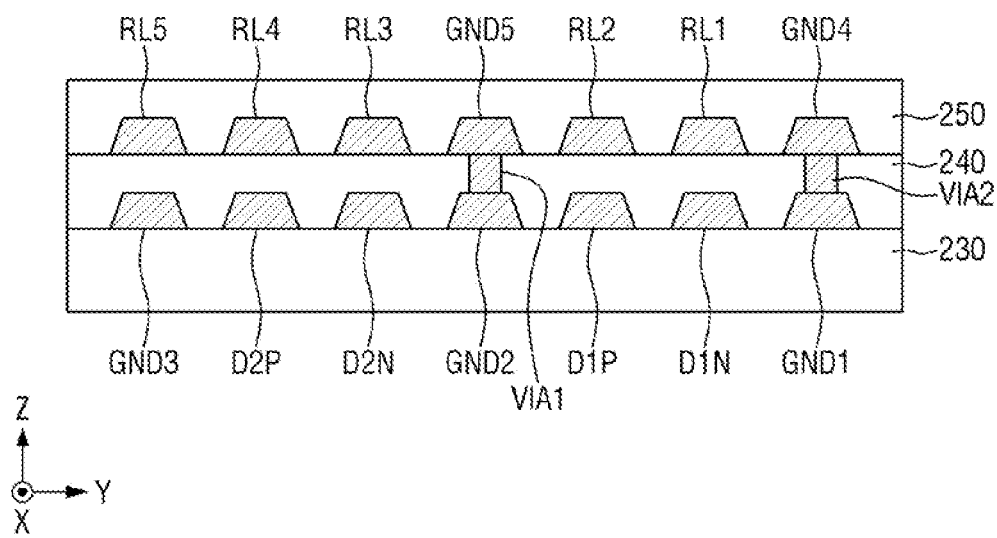
FIG. 10 is a sectional view illustrating a circuit board according to an embodiment of the present invention.

FIG. 10 is a sectional view illustrating a circuit board according to an embodiment of the present invention.

The embodiment of FIG. 10 is different from that of FIG. 6 in that inner regions of the plurality of vias VIA are filled with a metal material.

The metal filled in the inner regions of the plurality of vias VIA may include a metal material such as Cu, Ag, N, and W. The metal filled in the inner regions of the plurality of via VIA may be substantially the same as the metal constituting the plurality of first conductive lines 211 and the plurality of second conductive lines 212, but the present invention is not limited thereto.

When the inner regions of the plurality of vias VIA are filled with the metal material, since the ground voltage is applied to the inner regions of the plurality of vias VIA as well as the metal material of the walls constituting the plurality of vias VIA, it may be possible to reduce a capacitance value of the parasitic capacitor between the touch line and the data line, which are respectively disposed at both sides of the plurality of vias VIA. Therefore, cumulative reflection of the voltage change of the signals applied to the plurality of data lines in the signal flowing in the touch line may be reduced, whereby it may be possible that the touch driving circuit 40 may have increased accuracy in determining whether a touch input has been made, and may have increased accuracy in calculating a touch coordinate of a touch input.

Figure 11:
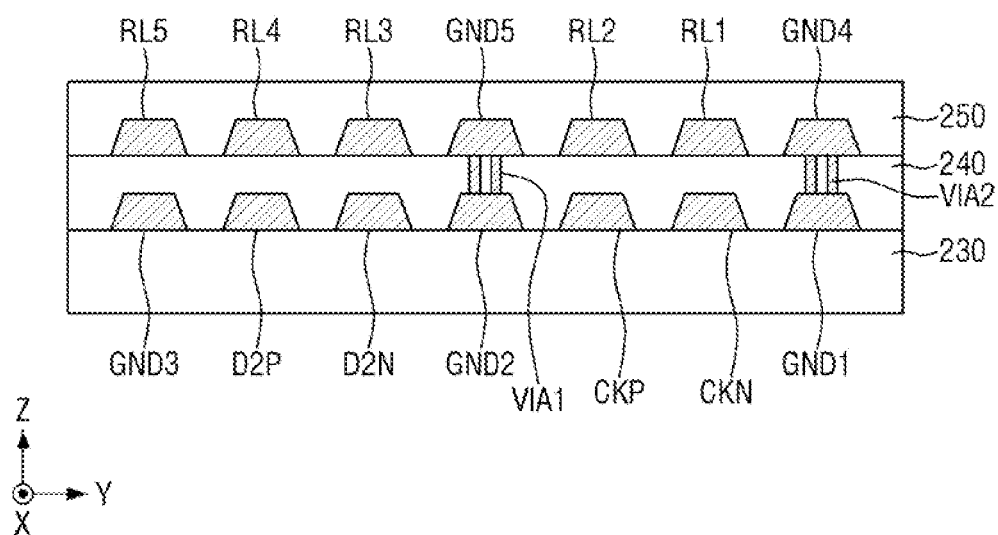
FIG. 11 is a sectional view illustrating a circuit board according to an embodiment of the present invention.

FIG. 11 is a sectional view illustrating a circuit board according to an embodiment of the present invention.

The embodiment of FIG. 11 is different from that of FIG. 6 in that the plurality of first conductive lines 211 include a clock line.

The clock line may be a conductive line to which clock voltages for generating a clock signal in the display driving circuit 30 are applied. The clock line may include a high voltage clock line CKP and a low voltage clock line CKN. The display driving circuit 30 may use a differential mode in generating the clock signal. For example, the display driving circuit 30 may use a difference between the signal applied to the high voltage clock line CKP and the signal applied to the low voltage clock line CKN to generate one clock signal.

The high voltage clock line CKP and the low voltage click line CKN may be disposed between the second ground line GND2 and the first ground line GND. A difference between a high voltage and a low voltage of the signals respectively applied to the high voltage clock line CKP and the low voltage clock line CKN may be greater than a difference between a high voltage and a low voltage of the signal applied to the third touch line RL3. Therefore, in the same manner as the data line, the change of the signals applied to the high voltage clock line CKP and the low voltage clock line CKN may be reflected in the signal flowing in the third touch line RL3.

However, the plurality of first vim VIA1 are disposed between the third touch line RL3 and the clock line CKP and CKN, it may be possible to reduce reflection of the signals flowing in the clock line in the touch line. Therefore, it may be possible that the touch driving circuit 40 may have increased accuracy in determining whether a touch input has been made, and may have increased accuracy in calculating the corresponding position of a touch input as a touch coordinate.

As described above, the plurality of vias VIA may reduce signal interference between the plurality of touch lines and the plurality of data lines and signal interference that may occur between the touch line and various signal lines, which are disposed on the circuit board 20. In addition, in the present invention, as an example, the description is based on that the plurality of touch lines are connected with the touch sensing line, but may be based on the conductive line connected with a touch driving line.

Figure 12:
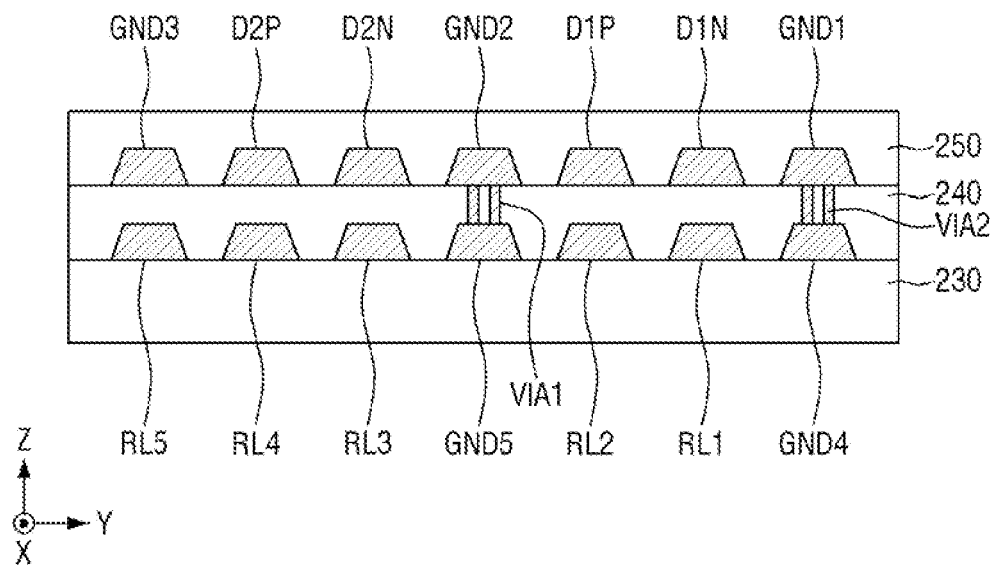
FIG. 12 is a sectional view illustrating a circuit board according to an embodiment of the present invention.

FIG. 12 is a sectional view illustrating a circuit board according to an embodiment of the present invention.

The embodiment of FIG. 12 is different from that of FIG. 6 in that, among the plurality of conductive lines 211 and 212, the plurality of second conductive lines 212 connected with the touch connection pads TCPD re disposed on the base substrate 230 and the plurality of first conductive lines 211 connected with the display connection pads DCPD are disposed on the first insulating layer 240. Therefore, a repeated description of FIG. 12 will be omitted.

Figure 13:
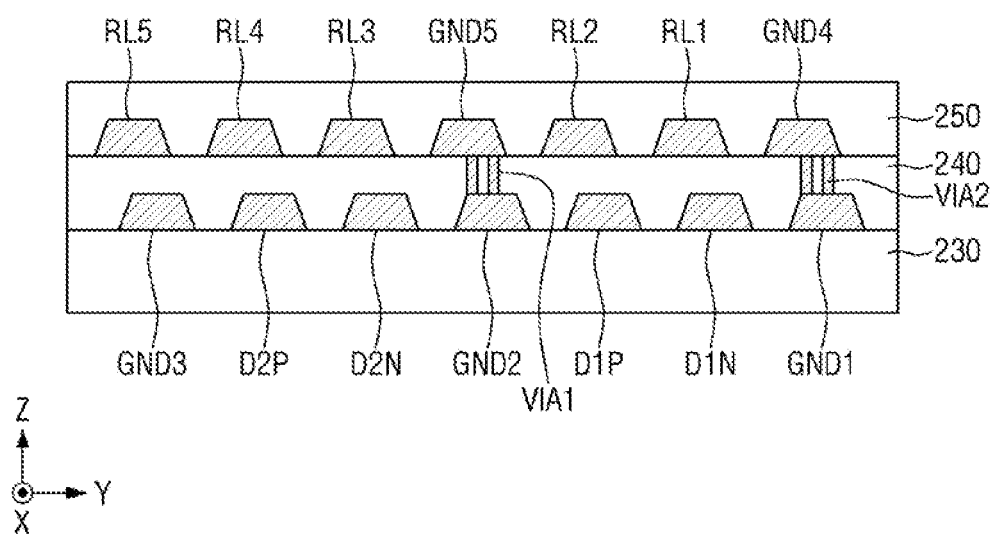
FIG. 13 is a sectional view illustrating a circuit board according to an embodiment of the present invention.

FIG. 13 is a sectional view illustrating a circuit board according to an embodiment of the present invention.

The embodiment of FIG. 13 is different from that of FIG. 6 in that the plurality of first conductive lines 211 partially overlap the plurality of second conductive lines 212 in the third direction Z.

The plurality of first conductive lines 211 and the plurality of second conductive lines 212 may fully overlap each other in the third direction Z as shown in FIG. 6, or may partially overlap each other as shown in FIG. 13. Moreover, a portion of the plurality of first conductive lines 211 and a portion of the plurality of second conductive lines 212 might not overlap each other in the third direction Z. However, a ground line included in the plurality of first conductive lines 211 may be formed to partially overlap a ground line included in the plurality of second conductive lines 212 in the third direction Z, and the plurality of vias VIA should be formed in the region where the ground line of the plurality of first conductive lines 211 partially overlaps the ground line of the plurality of second conductive lines 212 in the third direction Z. For example, a first region of the ground line of the plurality of first conductive lines 211 and a second region of the ground line of the plurality of second conductive lines 212, which overlaps the first region, are connected to each other by the plurality of vias VIA.

Figure 14:
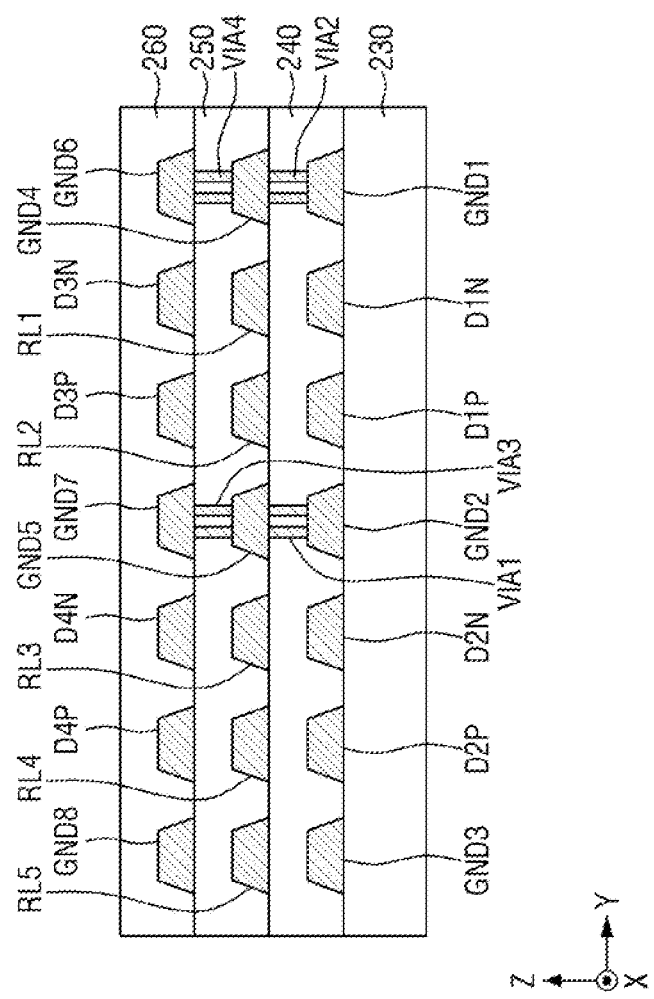
FIG. 14 is a sectional view illustrating a circuit board according to an embodiment of the present invention.

FIG. 14 is a sectional view illustrating a circuit board according to an embodiment of the present invention.

The embodiment of FIG. 14 is different from that of FIG. 6 in that the circuit board 20 includes the plurality of first conductive lines 211 disposed on the second insulating layer 250, and a third insulating layer 260 disposed on the second insulating layer 250 and the plurality of first conductive lines 211.

In FIG. 14, the plurality of conductive lines 211 and 212 disposed on the circuit board 20 are formed as three or more layers. For example, the plurality of conductive lines 211 and 212 may be formed as four layers or more.

The plurality of first conductive lines 211 may be formed by being divided into two layers. In FIG. 14, when the plurality of first conductive lines 211 are formed by being divided into two layers, the plurality of second conductive lines 212 are formed between the two layers forming the plurality of first conductive lines 211. However, without limitation to this example, for example, the plurality of first conductive lines 211 may be divisionally formed on the base substrate 230 and the first insulating layer 240, and the plurality of second conductive lines 212 may be disposed on the second insulating layer 250. In addition, the plurality of second conductive lines 212 may be formed by being divided into two layers.

The plurality of first conductive lines 211 may further include sixth to eighth ground lines GND6, GND7 and GND8, third data lines D3P and D3N, and fourth data lines DP and D4N. The plurality of first conductive lines 211 disposed on the second insulating layer 250 may be arranged in the second direction Y in the order of the eighth ground line GND8, the fourth high voltage data line D4P, the fourth low voltage data line D4N, the seventh ground line GND7, the third high voltage data line D3P, the third low voltage data line D3N, and the sixth ground line GND6.

The seventh ground line GND7 may overlap the fifth ground line GND5 in the third direction Z, and the sixth ground line GND6 may overlap the fourth ground line GND4 in the third direction Z. A plurality of third vies VIA3 may be disposed between the seventh ground line GND7 and the fifth ground line GND5, and a plurality of fourth via VIA4 may be disposed between the sixth ground line GND6 and the fourth ground line GND4.

When the plurality of conductive lines 211 and 212 of the circuit board 20 are formed as three or more layers, the number of plurality of data lines that affect any one touch line may be more than the case that the plurality of conductive lines 211 and 212 are formed as two layers. However, the plurality of vias VIA are formed between the ground lines that are between the respective layers, and the spaced width between the plurality of vias VIA is controlled, whereby cumulative reflection of the voltage change of the signals applied to the plurality of data lines in the signal flowing in my one touch line may be reduced.

For example, the voltage change of the signal applied to the third high voltage data line D3P as well as the first high voltage data line D1P may be reflected in the third touch line RL3. However, the plurality of first vias VIA1 may be disposed between the third touch line RL3 and the first high voltage data line D1P. The plurality of third vim VIA3 may be disposed between the third touch line RL3 and the third high voltage data line D3P, and the spaced width between the plurality of first vies VIA1 and the spaced with between the plurality of third vias VIA3 may be disposed to be relatively small. As a result, it may be possible to reduce reflection of each of the voltage change of the signal applied to the first high voltage data line D1P and the voltage change of the signal applied to the third high voltage data line D3P in the signal flowing in the third touch line RL3.

In FIG. 14, the plurality of first vim VIA1 are formed between the second ground line GND2 and the fifth ground line GDN5, and the plurality of third vias VIA3 are formed between the fifth ground line GND5 and the seventh ground line GND7, but the present invention is not limited thereto. For example, the plurality of first vias VIA1 and the plurality of third vies VIA3 may be provided with holes formed to pass through the second insulating layer 250, the fifth ground line GND5 and the first insulating layer 240, and inner walls of the holes may be subjected to plating, whereby the plurality of first via VIA1 and the plurality of third vias VIA3 may be formed as a single body.

In addition, the plurality of first via VIA1 and the plurality of third vias VIA3 may be formed to partially overlap each other in the third direction Z, but the present invention is not limbed thereto. The plurality of first vias VIA1 and the plurality of third vias VIA3 may be formed to not overlap each other in the third direction Z.

While the present invention has been described with reference to the embodiments thereof, it will be understood by those of ordinary skid in the art that various changes in form and detail may be made thereto without departing from the spirit and scope of the present invention.

What is claimed is:

1. A display device comprising:
   a panel comprising a display region for displaying an image and a touch region overlapping the display region; and
   a circuit board disposed at one side of the panel, and comprising a first conductive layer, a second conductive layer and a first insulating layer interposed between the first conductive layer and the second conductive layer,
   wherein the circuit board comprises:
   a base substrate;
   a plurality of data lines disposed on the base substrate and electrically connected with a plurality of data signal lines disposed in the display region;
   a plurality of touch lines electrically connected with a plurality of touch electrodes disposed in the touch region; and
   a first ground line disposed between at least two or more of the plurality of data lines and the plurality of touch lines, wherein the first ground line comprises a first part of the first conductive layer, a first part of the second conductive layer, and a first via passing through the first insulating layer and connecting the first part of the first conductive layer with the first part of the second conductive layer, wherein the first part of the first conductive layer is disposed on the base substrate, and between two pairs of data lines of the plurality of data lines on the base substrate, wherein the first part of the second conductive layer is disposed between the plurality of touch lines on the first insulating layer, wherein the first insulating layer electrically insulates the two pairs of data lines from the plurality of touch lines.

2. The display device of claim 1, wherein the circuit board is divided into a first area positioned at one side of the first ground line and a second area positioned at the other side of the first ground line, and
   wherein the plurality of data lines or the plurality of touch lines disposed in the first area do not cross the plurality of data lines or the plurality of touch lines disposed in the second area.

3. The display device of claim 1, further comprising a second ground line included in either the first conductive layer or the second conductive layer.

4. The display device of claim 1, wherein the plurality of data lines comprises at least one first data line that is a part of the first conductive layer, and the plurality of touch lines are a part of the second conductive layer.

5. The display device of claim 4, wherein the plurality of data lines further comprises at least one second data line that is a part of the second conductive layer.

6. The display device of claim 1, further comprising a display driving chip disposed on the panel,
   wherein the panel further comprises a ground connection line connecting the first ground line of the circuit board with the display driving chip.

7. The display device of claim 1, further comprising a touch driving chip disposed on the circuit board,
   wherein at least one of the plurality of touch lines is electrically connected with the touch driving chip.

8. The display device of claim 1, wherein an inner region of the first via is filled with a conductive material.

9. A display device comprising:
   a panel comprising a display region for displaying an image and a touch region overlapping the display region; and
   a circuit board disposed at one side of the panel, and comprising a first conductive layer, a second conductive layer and a first insulating layer interposed between the first conductive layer and the second conductive layer,
   wherein the circuit board comprises:
   a plurality of data lines electrically connected with a plurality of data signal lines disposed in the display region;
   a plurality of touch lines electrically connected with a plurality of touch electrodes disposed in the touch region; and
   a first ground line disposed between at least two or more of the plurality of data lines and the plurality of touch lines, wherein the first ground line comprises a first part of the first conductive layer, a first part of the second conductive layer, and a first via passing through the first insulating layer and connecting the first part of the first conductive layer with the first part of the second conductive layer, wherein the circuit board further comprises a third conductive layer, and a second insulating layer interposed between the second conductive layer and the third conductive layer,
   wherein the plurality of data lines comprises at least one first data line that is a part of the first conductive layer and at least one second data line that is a part of the third conductive layer, and
   the plurality of touch lines are a part of the second conductive layer.

10. The display device of claim 9, wherein the circuit board further comprises a second ground line disposed between at least two or more of the plurality of data lines and the plurality of touch lines, wherein the second ground line comprises the first part of the second conductive layer, a first part of the third conductive layer, and a second via passing through the second insulating layer and connecting the first part of second conductive layer with the first part of the third conductive layer.

11. The display device of claim 10, wherein the first via and the second via at least partially overlap each other in a thickness direction of the circuit board.

12. A display device comprising:
    a display panel for displaying an image;
    a circuit board disposed at one side of the display panel, wherein the circuit board comprises a plurality of conductive lines; and
    a display driving chip disposed on the display panel, wherein the circuit board comprises:

a plurality of first conductive lines;

an insulating layer disposed on the plurality of first conductive lines;

a plurality of second conductive lines disposed on the insulating layer;

a via hole passing through the insulating layer; and a conductive via disposed in the via hole and electrically connecting at least one of the plurality of first conductive lines with at least one of the plurality of second conductive lines, wherein the conductive via includes an inner side and an outer side, each of which has a closed figure shape on a plane view, wherein the display panel further comprises a plurality of display signal lines electrically connecting the first conductive lines, the second conductive lines, and the conductive via with the display driving chip.

13. The display device of claim 12, wherein an inner space surrounded by the inner side of the conductive via is filled with air, or is empty.

14. The display device of claim 12, wherein an inner space surrounded by the inner side of the conductive via is filled with an insulating material.

15. The display device of claim 14, wherein the insulating material filling the inner space is different from a material of the insulating layer.

16. The display device of claim 12, wherein an inner space surrounded by the inner side of the conductive via is filled with a conductive material.

17. The display device of claim 12, wherein the outer side of the conductive via has a diameter of about ½ or more of a line width of each of the plurality of first conductive lines.

18. The display device of claim 12, wherein the circuit board further comprises a plurality of conductive vias including the conductive via and spaced apart from each other in an extended direction of the at least one first conductive line of the plurality of first conductive lines.

19. The display device of claim 18, wherein a spaced distance between the plurality of conductive vias is smaller than a line width of the at least one first conductive line of the plurality of first conductive lines.

20. The display device of claim 12, wherein a ground voltage is applied to the at least one first conductive line of the plurality of first conductive lines and the least one second conductive line of the plurality of second conductive lines, which is electrically connected with the at least one first conductive line of the plurality of first conductive lines by the conductive via.

* * * * *